(12) United States Patent
Ellis et al.

(10) Patent No.: US 6,646,949 B1
(45) Date of Patent: Nov. 11, 2003

(54) WORD LINE DRIVER FOR DYNAMIC RANDOM ACCESS MEMORIES

(75) Inventors: Wayne F. Ellis, Jericho, VT (US); Louis L-C. Hsu, Fishkill, NY (US); Jack A. Mandelman, Stormville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/537,498

(22) Filed: Mar. 29, 2000

(51) Int. Cl.[7] ................................................ G11C 8/00
(52) U.S. Cl. ..................... 365/230.06; 365/230.08; 365/189.11; 326/105; 326/106
(58) Field of Search ................... 365/230.06, 189.11, 365/230.08; 326/105, 106

(56) References Cited

U.S. PATENT DOCUMENTS

| | | | |
|---|---|---|---|
| 5,410,508 A | 4/1995 | McLaury | 365/189.09 |
| 5,416,747 A | 5/1995 | Ohira | 365/230.06 |
| 5,650,976 A | 7/1997 | McLaury | 365/230.06 |
| 5,654,913 A | 8/1997 | Fukushima et al. | 365/149 |
| 5,802,009 A | 9/1998 | Casper et al. | 365/230.06 |
| 5,825,704 A | 10/1998 | Shau | 365/222 |
| 5,926,433 A | 7/1999 | McLaury | 365/230.06 |
| 6,097,665 A * | 8/2000 | Tomishima et al. | 365/230.06 |
| 6,104,665 A * | 8/2000 | Hung et al. | 365/230.06 |
| 6,118,723 A * | 9/2000 | Agata et al. | 365/230.03 |
| 6,137,725 A * | 10/2000 | Caser et al. | 365/185.23 |

OTHER PUBLICATIONS

*A 30–ns 256–Mb DRAM with a Multidivided Array Structure*; T. Sugibayashi, et al.; IEEE Journal of Solid–State Circuits, vol. 28, No. 11, Nov. 1993.

* cited by examiner

*Primary Examiner*—Hoai Ho
*Assistant Examiner*—Connie C. Yoha
(74) *Attorney, Agent, or Firm*—Connolly, Bove, Lodge & Hutz LLP

(57) ABSTRACT

A word line for a row of memory elements of a dynamic random access memory. A first transistor is connected to a source of negative potential and to the word line for switching the word line to a source of negative potential in response to a decoder signal. A diode is additionally connected to the word line and to a selector signal. A second transistor applies a positive potential to the word line in response to a decoder signal. The word line is charged to a positive potential. The word line is reset to a substantially negative potential in two stages. In the first stage, conduction is through the diode to a ground connection which dissipates a majority of the charge of the word line. The remaining charge is dissipated during a second stage when the first transistor discharges the word line remaining charge through a source of negative potential.

7 Claims, 5 Drawing Sheets

WORD LINE DRIVER FOR DYNAMIC RANDOM ACCESS MEMORIES

BACKGROUND OF THE INVENTION

The present invention relates to scaled down dynamic random access memory (RAM) cells which operate with a negative word line voltage. Specifically, a word line driver circuit is described which employs a two-state stage pull-down process for resetting the word line voltage to a negative potential.

Increasing DRAM cell density requires that each cell feature size be reduced. The reduction in cell size requires a corresponding reduction in the MOSFET device sizes which provide one bit data storage. Practical limitations are imposed on the MOSFET size because a reduced gate insulator thickness reduces the reliability of the device, and the threshold voltage must remain sufficiently high to maintain the channel conduction OFF. These limits are reached when MOSFET device feature sizes of 150 nm and smaller are fabricated.

Reduction of the MOSFET threshold voltage Vt has been achieved using a negative word line off voltage such as −0.5 volts to hold the device in a nonconducting state. With the use of a negative world line off voltage, the smaller device with a reduced Vt may be used which also requires a lower voltage Vth for setting a bit level on the DRAM cell.

Channel doping requirements for a MOSFET device using a negative word line off voltage are also reduced. The corresponding reduction in channel doping reduces junction leakage for the storage device, thus improving the data retention time for the device.

Problems occur in resetting the word line voltage from a positive writing voltage to an OFF state wherein the word line is returned to the negative bias voltage. The word line must be driven from the positive voltage to the negative level without generating a voltage bounce on adjacent word lines which are also connected to the same negative bias voltage source. As the negative bias voltage source tends to have a higher impedance, the word line discharge will cause a local voltage increase (i.e., voltage bounce) on the negative word line voltage source which is coupled to other word lines. The inadvertent coupling of the voltage bounces occurring from one line to adjacent lines will tend to reduce the stored data charge on the adjacent cells which are written with the adjacent word lines. The problem is exacerbated when the array of word lines is subject to addressing patterns which cause repeated local voltage bounces coupled to adjacent word lines.

A word line driver has been disclosed in U.S. Pat. Nos. 5,650,976 and 5,410,508 which seeks to avoid the foregoing problems by discharging the word line in two stages. During a first stage of discharge, the word line is connected to ground through a PMOS transistor, which discharges the word line until the voltage across the PMOS transistor reaches approximately 0.65 volts. During a following second discharge phase, the word line is connected through an NMOS transistor to a negative potential which further discharges the word line to a lower potential.

The two state process described in the foregoing patents has some disadvantages associated with it. The first is that the PMOS transistor is connected back through a relatively high impedance path to ground which decreases the speed of discharge. The discharge time is reduced by reducing the device threshold voltage. However, the lower threshold voltage devices have an increased leakage current, and the gate of the PMOS and NMOS transistor must be driven to the Vneg voltage which requires a larger voltage swing on the gates of these transistors. The larger voltage swing severely stresses the transistor gates which can reduce the device reliability.

A further disadvantage may result when word lines are half selected which forces the PMOS transistor to turn on and allow a d.c. current to flow and reduce the Vneg voltage. Any short term reduction of the Vneg potential will result in the charge on the memory cell capacitor being reduced thus impairing the integrity of the stored data.

The present invention is directed to a circuit for minimizing the voltage bounce when returning a word line to a negative OFF voltage potential using a two stage pull down process which avoids these disadvantages.

SUMMARY OF THE INVENTION

A word line driver is provided for a row of memory elements of a dynamic random access memory. Each of the transistor memory elements have an associated storage capacitor, and a word line is connected to the gate of the transistor of a row of memory elements for enabling charging of the storage capacitor of each memory element. A first transistor of the word line driver is connected to a source of negative potential and to the word line for switching the word line to a source of negative potential in response to a decoder signal. A diode connects the word line to a first selector signal which forward and reverse biases the diode, alternately permitting the word line to be connected to ground. A second transistor drives the word line to a positive potential in response to a second selector signal. When the word line is deselected, the second transistor conducts the positive potential from the word line, and the diode initially conducts current, bringing the word line to substantially zero volts. The first transistor then brings the word line potential to a negative potential. By employing a two-stage process for resetting the word line, first to ground and then to a negative potential, a voltage bounce which occurs along the bus carrying the negative potential is reduced.

DESCRIPTION OF THE PREFERRED EMBODIMENT

Figure 1:
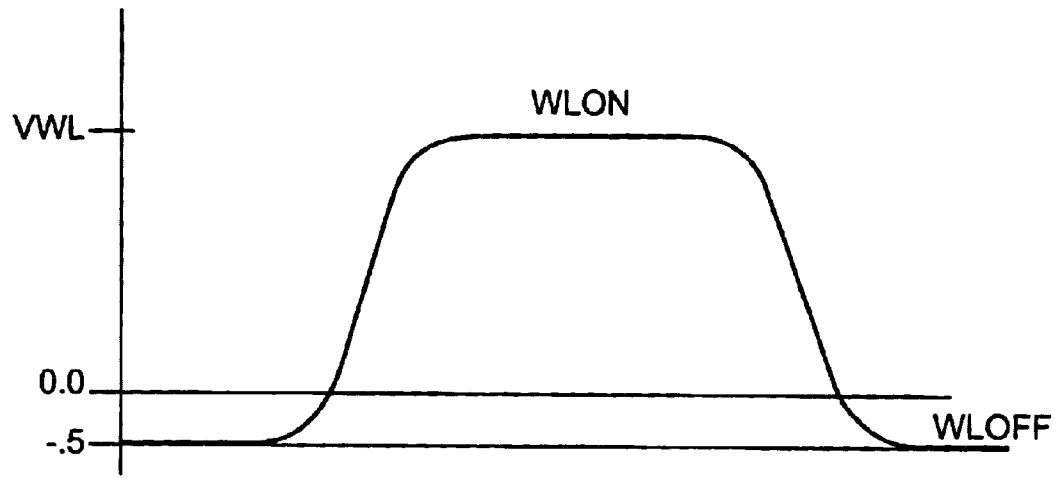
FIG. 1 illustrates the voltage swing on a word line which has a negative voltage.
Figure 2:
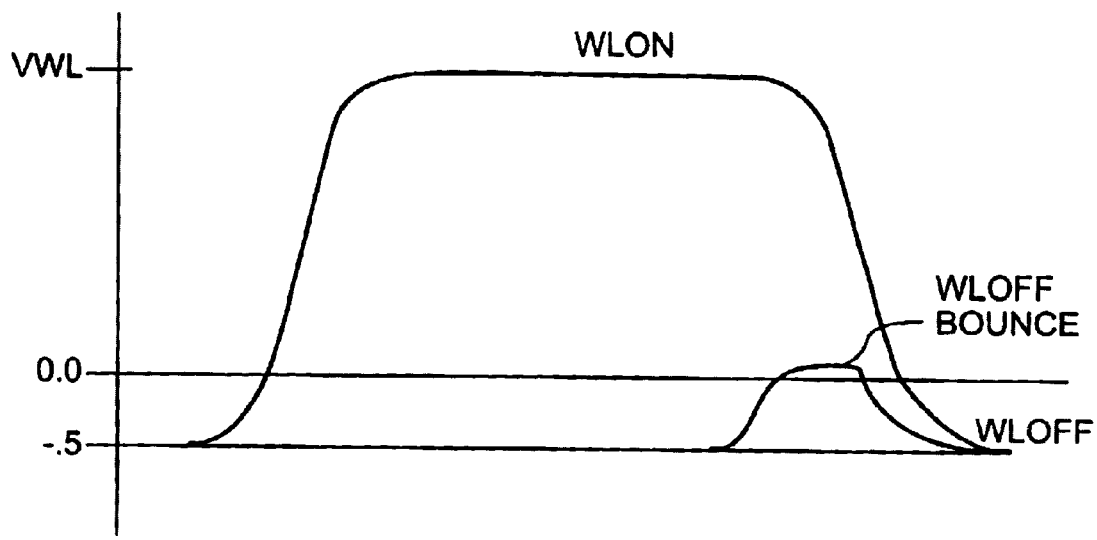
FIG. 2 is an illustration of the word line voltage swing and bounce voltage produced on the negative voltage bus.

FIG. 1 illustrates the voltage of a word line when it is connected to a read or write potential of WL. During this time, a word line driver places a potential VWL on the word line which is coupled to the gate of each memory cell transistor of a given row of an array of memory cells. In order to reduce device sizes, and thereby increase the array density so that larger arrays can be manufactured, the prior art has suggested a negative OFF voltage shown in FIG. 1 for the word line. During periods of time in which the memory cell is not to be read or written, the row of memory cells is held in an OFF state, so that the charge in each memory cell is maintained and cannot leak off. The negative voltage is derived from a voltage pumped circuit which is generally a high impedance voltage source, and each of the word lines is connected to the negative voltage bus connected to the negative voltage source. During switching from the ON potential VWL to the OFF state, a local voltage pulse or bounce is experienced on the negative voltage bus. As illustrated in FIG. 2, the bounce voltage produced when one word line is returned to the negative OFF voltage state, WLOFF, increases above zero volts. The local bounce voltage coupled to the negative bias voltage bus occurs because of the limited capability of the high impedance of the negative source to rapidly discharge the word line. The effect of raising the negative bus voltage line above zero volts results in an increase of the drain current of the respective memory cell transistors of a row. The result is a leakage of charge on the cell capacitors thereby affecting the data value represented by the stored charge.

Figure 3:
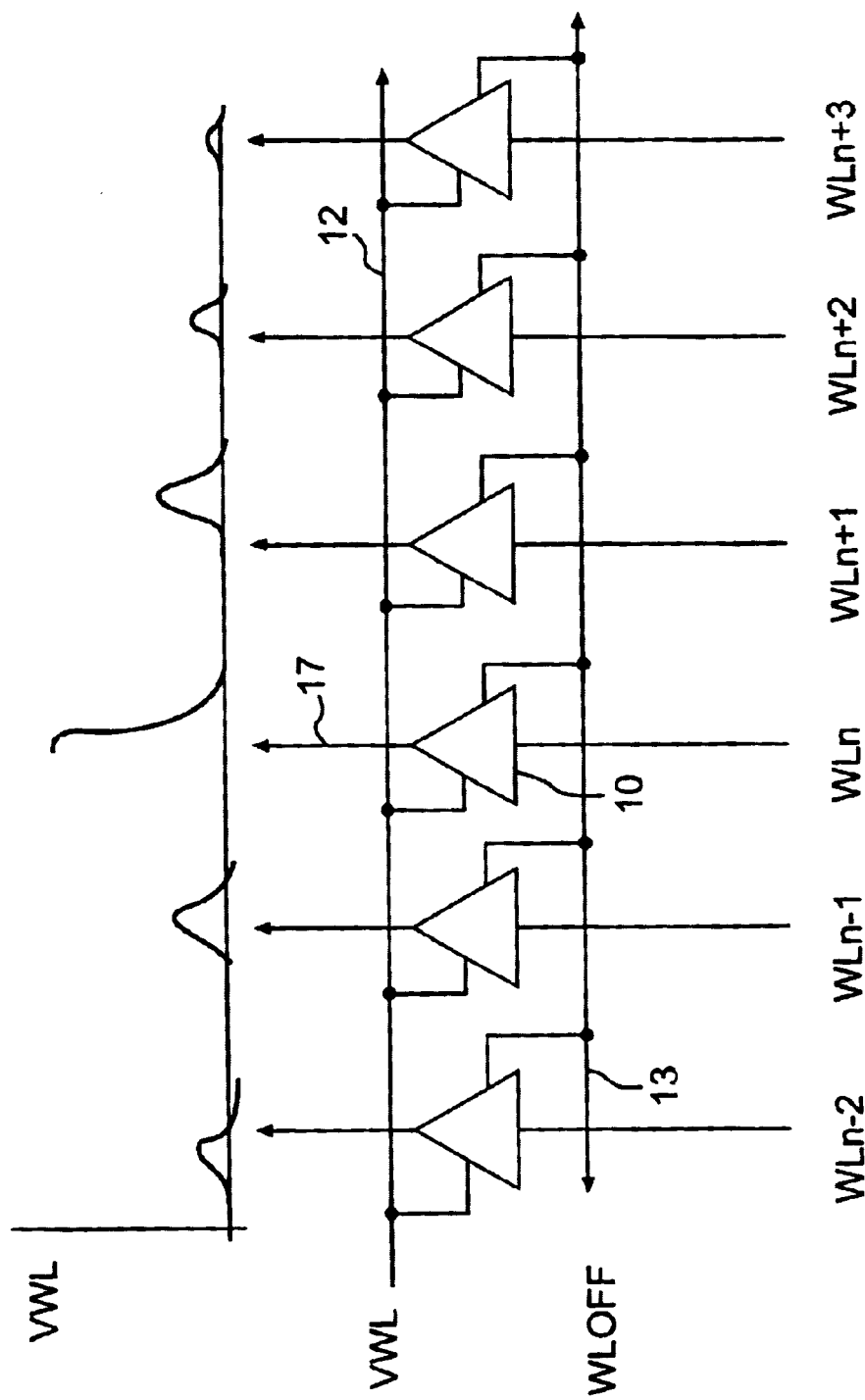
FIG. 3 illustrates the propagation of the bounce voltage along the negative voltage bus.

FIG. 3 illustrates how the local bounce voltage WLOFF propagates along the negative voltage bus 13. The VWL bus 12 provides the ON voltage for turning ON the gate transistors of a respective row. When the row line WLN is being switched from VWL to WLOFF by driver 10, the local bounce voltage magnitude decreases for each of the word lines in a decreasing magnitude for lines which are further away from the switched word line 17.

Figure 4:
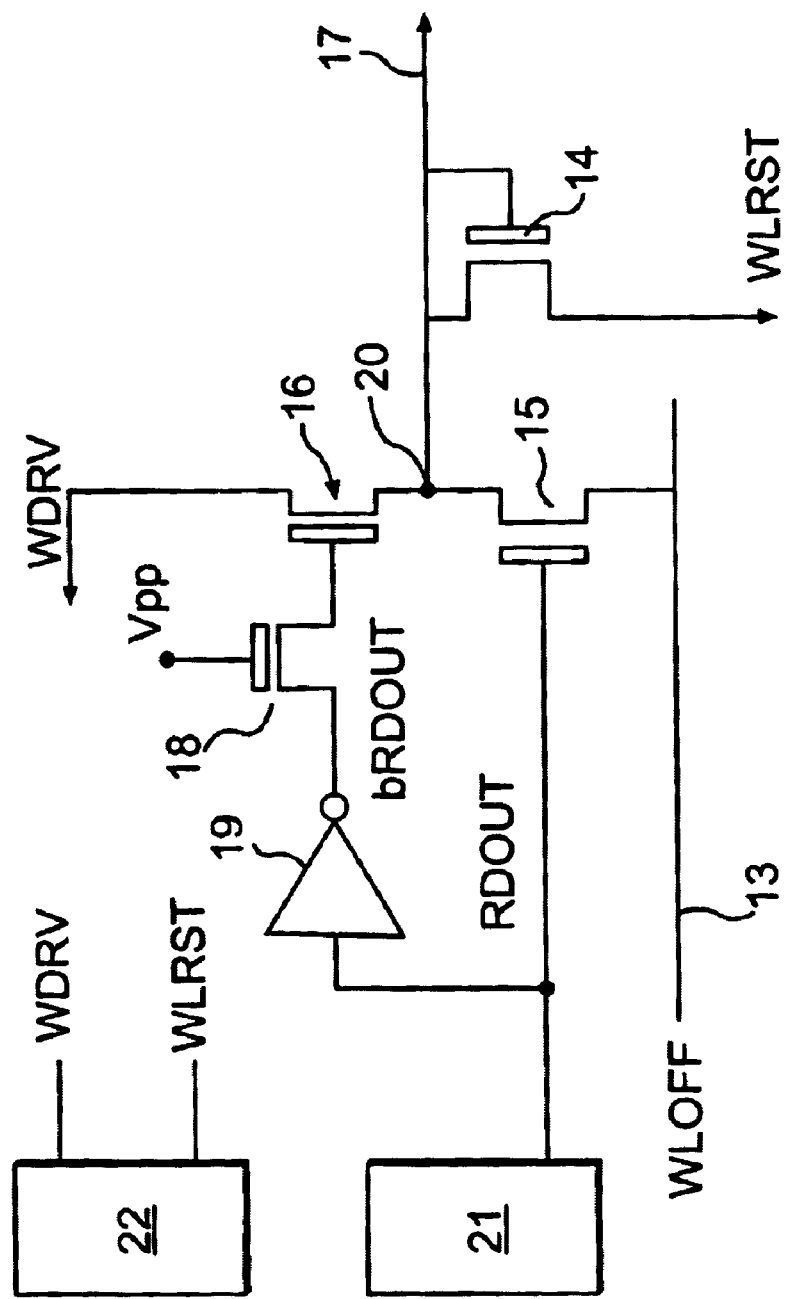
FIG. 4 illustrates the word line driver in accordance with a preferred embodiment which reduces the local bounce voltage on the negative voltage bus.

A driver in circuit in accordance with the preferred embodiment for reducing the voltage bounce applied to the negative voltage bus 13 is shown more particularly in FIG. 4. Referring now to FIG. 4, there is shown a circuit which drives a word line 17 connected to a plurality of gates of a row of cells.

The word driver circuit of FIG. 4 receives inputs from a line decoder 21 as well as inputs WDRV and WLRST from a selector. The decoder 21 and selector 22 are known in conventional DRAM technology for providing outputs which will drive the word line between its ON voltage VWL and its OFF voltage WLOFF.

The output signal from the decoder 21 RDOUT is supplied to a level shifter 19 where the signal level is inverted as well as level shifted. The level shifted signal bRDOUT is applied to the drain of a transistor 18. Transistor 18 supplies the voltage Vpp to the gate of pull-up transistor 16. During periods when the RDOUT signal is low, the pull-up PMOSFET transistor 16 is enabled to charge the node 19 to a voltage Vpp-Vt. The boost circuit comprising FET transistors 16 and 18 provides a boosted voltage to node 19 when the signal WDRV from the selector 22 goes to a high of Vpp. The PMOSFET transistor 16 is turned ON, and transistor 14, connected as a diode between the common ground voltage and word line 17, is reverse biased because WL RST is at zero. Accordingly, the word line 17 charges to the Vpp level.

During a deselection process, wherein the word line 17 is returned to the negative bias voltage on bias voltage bus 13, the word line 17 is pulled down in two stages. The first occurs when WLRST goes to zero, permitting a positive charge on word line 17 to bleed off to a common ground for voltage supply Vpp through a path having a generally lower impedance than the negative bus 13. The word line 17 voltage decreases from Vpp to the voltage threshold of the device 16. Word line 17 is then further discharged through the NMOS transistor 15 which, because of the state of RDOUT, renders NFET transistor 15 conducting. Word line selection can be driven either by a deselection circuit 22 or the decoder 21. In either case, two stage word line pull down is achieved utilizing the NFET 14 connected as a diode.

Figure 5A:
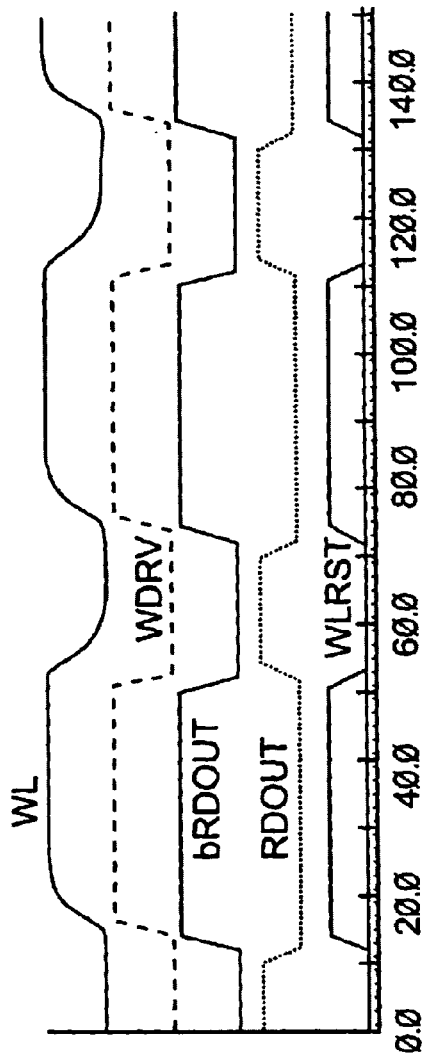
FIG. 5a illustrates the voltage wave forms for the circuit of FIG. 4 when the word line is deselected by the driver.

The process for deselecting a word line 17 using the decoder 21 is shown more particularly in FIG. 5A. Referring now to FIG. 5A, the word line is shown having an initial voltage level which rises to Vpp. WDRV and WLRST are applied in coincidence to the PFET 16 and NFET 14, respectively, and word line 17 is deselected in response to RDOUT rising. The negative going voltage provided by WDRV and WLRST result in the enabling of nFET transistor 14 and disabling PFET transistor 16, and the rising voltage RDOUT turns on transistor 15. Thus, the two stage process for draining the charge accumulated on word line 17 is completed.

Figure 5B:
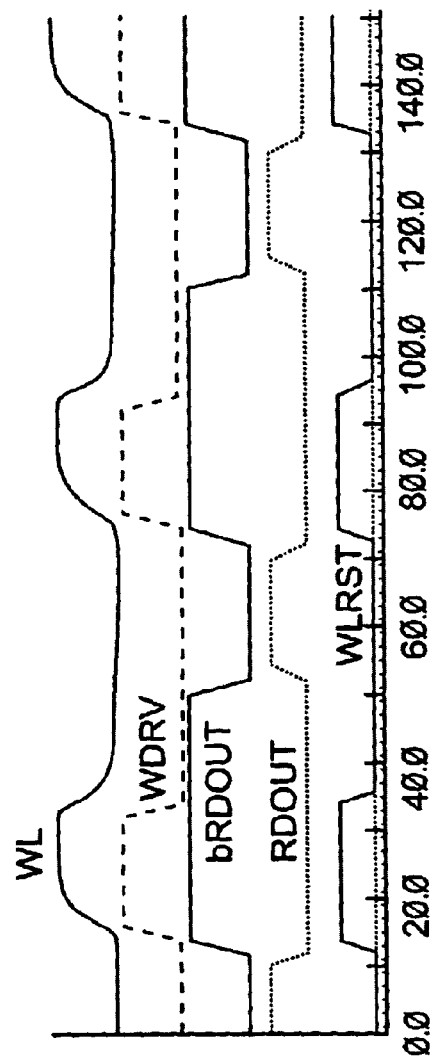
FIG. 5b illustrates the voltage waveforms for the circuit of FIG. 4 when the word line is deselected by the selector.

FIG. 5B illustrates the voltage waveforms which are used when the selector 22 provides for deselection of word line 17. Referring now to FIG. 5B, word line 17 voltage WL decreases when WDRV goes to zero, thereby disabling NFET transistor 17. At the same time, WLRST goes to zero, permitting a discharge of the word line 17 through NFET transistor 16. Once word line 17 has discharged to the threshold voltage of NFET transistor 16, further discharge occurs through the NFET transistor 15 to the negative voltage bus 13.

Figure 6:
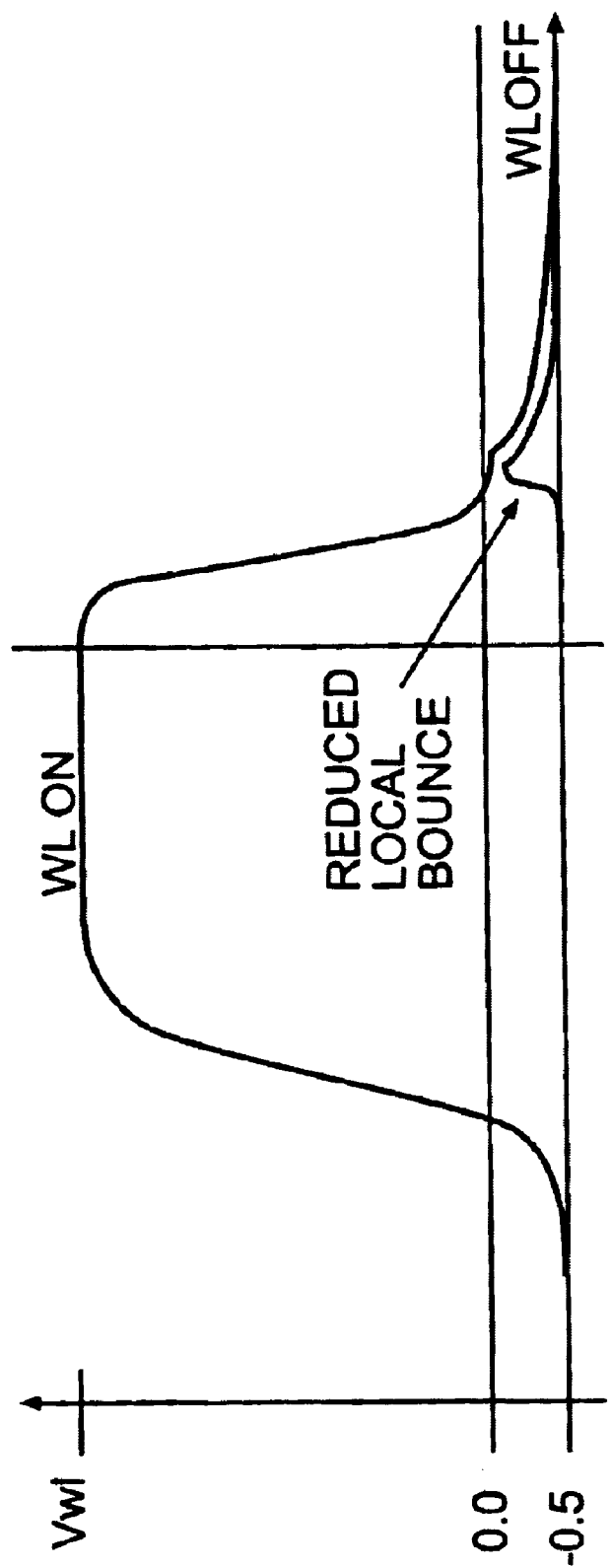
FIG. 6 illustrates the reduction in local bounce voltage produced on the negative voltage bus.

The net effect of the two stage discharge of the word line 17 is to provide during the first stage a low impedance path in which to discharge the word line 17 through the low resistance NFET 14. Once the NFET transistor 14 has stopped conducting, most of the charge on line 17 has been removed and a smaller remaining charge is removed through NFET 15. As a result of removing most of the charge to ground through the low impedance path of transistor 14 and the selector 22, a reduced local voltage bounce is produced as shown in FIG. 6. The reduced local voltage bounce coupled to adjacent word lines produces very little, if any, loss of charge on the capacitor of memory cells connected to the word line.

The word line driver NMOS transistor 15 and PMOS transistor 16 have a voltage swing which is from ground to the Vt of the device avoiding the large voltage swings needed in the aforementioned prior art device, nor is a discharge path provided for the memory cell capacitor when the word lines are half selected as is possible with aforementioned prior art word line drivers.

The foregoing process provides discharge of the word line to its final negative bias voltage WLR, in a fraction of the time of the equalization and restoration time for a memory cell bit. During the equalization and restoration of the cell bit lines, some voltage leaks from the memory cell. In a worst case scenario, the time to remove 50 millivolts from a newly-written memory cell can be determined when the cell gate remains at zero voltage. This time can be compared to the expected discharge time for bringing the word line from zero volts to −0.5 volts, which is in the order of 15 nanoseconds. For a cell capacitor value of 35 fF, a voltage discharge of 50 millivolts occurs in a time dt which can be calculated as follows:

$dt = C\ cell \times dV/i$ $dt = 35\ E{-}15F \times 50\ E{-}3V/I\ E{-}10A$ $dt = 1750\ E{-}8$ seconds The discharge time (dt) to leak off 50 mV is at least of three orders of magnitude higher than the discharged time of 15 nanoseconds. Thus, the word line driver in accordance with the invention discharges the word line from ground to −0.5 volts at a rate which produces a negligible discharge of the cell capacitor. Accordingly, any local WLOFF bounce voltage induced on the line will not result in any significant discharge of the cell capacitor.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A word line driver for a memory element of a dynamic random access memory comprising:
   a word line connected to a plurality of memory elements;
   a first transistor connected to a source of negative potential and to said word line for switching said word line to said source of negative potential in response to a first decoder signal RDOUT;
   diode connected to said word line and to receive a selector signal WLRST; and
   a second transistor connected to a selector signal WDRV which switches between a positive potential and zero volts, and to said word line, said second transistor having a gate connected to receive a signal bRDOUT which is a delayed complement to said decoder signal RDOUT, said second transistor driving said word line to a positive potential in response to said selector signal WLRST being at said substantially positive potential, and in response to said decoder complement signal bRDOUT being, and said word line being driven first to substantially zero volts through said diode when said selector signal WLRST is at zero volts and said RDOUT signal enables said first transistor, and then to substantially said negative potential through said first transistor.

2. The word line drive according to claim 1 wherein said diode is a transistor with a gate and source connected to said word line and a drain connected to receive said selector signal WLRST.

3. The word line driver according to claim 1 wherein said signal bRDOUT is generated by a level shifter circuit connected in series with a third transistor and a gate of said second transistor, said level shifter circuit receiving said RDOUT signal as an input signal.

4. The word line driver according to claim 3 wherein said third transistor has a gate connected to a positive potential for charging said word line through said second transistor.

5. A word line driver circuit comprising:
   a source of negative voltage;
   a diode connecting said word line to a selector signal WLRST which in a first state provides a potential for reverse biasing said diode, and which provides a discharge path for said word line when said selector signal WLRST is in a second state;
   a switching circuit for connecting said word line to said negative voltage in response to a decoder signal RDOUT for providing a second discharge path for said word line to said source at negative voltage; and
   a pull-up circuit connecting said word line to a positive potential in response to a complement of said decoder signal RDOUT.

6. The word line circuit according to claim 5 wherein said pull-up circuit is connected to receive a second selector signal WDRV which along with said complement of said decoder signal RDOUT enables said pull-up circuit to connect said word line to said positive potential.

7. The word line circuit according to claim 6 wherein said pull-up circuit comprises:
   a first transistor connected between said word line and a source of positive potential;
   an inverter circuit connected to receive said decoder signal RDOUT; and
   a second transistor connecting said inverter output to a gate of said first transistor, said second transistor having a gate connected to a positive supply of voltage for charging said word line through said first transistor.

* * * * *